US009143315B2

(12) United States Patent
Buckler et al.

(10) Patent No.: US 9,143,315 B2
(45) Date of Patent: Sep. 22, 2015

(54) PREDICTIVE PERIODIC SYNCHRONIZATION USING PHASE-LOCKED LOOP DIGITAL RATIO UPDATES

(71) Applicant: ADVANCED MICRO DEVICES, INC., Sunnyvale, CA (US)

(72) Inventors: Mark Buckler, Acton, MA (US); Sudha Thiruvengadam, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 55 days.

(21) Appl. No.: 14/064,045

(22) Filed: Oct. 25, 2013

(65) Prior Publication Data
US 2015/0117582 A1  Apr. 30, 2015

(51) Int. Cl.
*H03D 3/24* (2006.01)
*H04L 7/033* (2006.01)

(52) U.S. Cl.
CPC .................................. *H04L 7/0331* (2013.01)

(58) Field of Classification Search
CPC ........ H03L 2207/50; H03L 7/191; H03L 7/00
See application file for complete search history.

(56) References Cited

U.S. PATENT DOCUMENTS

| 6,864,722 | B2  |   | 3/2005 | Adkisson |         |
|-----------|-----|---|--------|----------|---------|
| 7,187,742 | B1  | * | 3/2007 | Logue et al. | 375/376 |
| 7,343,510 | B1  | * | 3/2008 | Ross et al.  | 713/500 |
| 2003/0105985 | A1 | * | 6/2003 | Keller et al. | 713/400 |
| 2006/0271806 | A1 | * | 11/2006 | Castano et al. | 713/500 |
| 2008/0150605 | A1 | * | 6/2008 | Chueh et al. | 327/292 |
| 2008/0288805 | A1 | * | 11/2008 | Osborn et al. | 713/400 |
| 2009/0259874 | A1 | * | 10/2009 | Owen et al. | 713/500 |
| 2013/0343441 | A1 | * | 12/2013 | Alfieri | 375/224 |
| 2014/0015573 | A1 | * | 1/2014 | Ross et al. | 327/142 |

OTHER PUBLICATIONS

"A Predictive Synchronizer for Periodic Clock Domains", U. Frank, T. Kapshitz, R. Ginosar, © Springer Science + Business Media, LLC 2006, May 3, 2006.
"Understanding Clock Domain Crossing Issues", Saurabh Verma, Ashima S. Dabre, Atrenta, EE Times, http://www.eetimes.com/document.asp?doc_id=1279906, Published Sep. 17, 2012, Retrieved on Sep. 17, 2013, pp. 1-7.
"The Even/Odd Synchronizer: A Fast, All-Digital Periodic Synchronizer", William J. Dally, Stephen G. Tell, Stanford University, NVIDIA Corporation, © 2010 IEEE, pp. 75-84.

* cited by examiner

*Primary Examiner* — Shuwang Liu
*Assistant Examiner* — Sung Ahn
(74) *Attorney, Agent, or Firm* — Staniford Tomita LLP

(57) ABSTRACT

Embodiments are described for a method and system of enabling updates from a clock controller to be sent directly to a predictive synchronizer to manage instant changes in frequency between transmit and receive clock domains, comprising receiving receive and transmit reference frequencies from a phase-locked loop circuit, receiving receive and transmit constant codes from a controller coupled to the phase-locked loop circuit, obtaining a time delay factor to accommodate phase detection between the transmit and receive clock domains, and calculating new detection interval and frequency information using the time delay factor, the reference frequencies, and the constant codes.

13 Claims, 7 Drawing Sheets

PREDICTIVE PERIODIC SYNCHRONIZATION USING PHASE-LOCKED LOOP DIGITAL RATIO UPDATES

TECHNICAL FIELD

One or more implementations relate to predictive synchronizers, and more specifically low latency predictive synchronizers using phase-locked loop controllers.

BACKGROUND

Modern system-on-chip (SOC) devices often utilize multiple clocks that produce different clock domains within the same chip. Issues associated with clock domain crossings include metastability, data loss, and data incoherency. Metastability is caused when signals transition close to active clock edges such that setup or hold violations cause an output signal to oscillate indefinitely until a later clock signal settles it to a stable value. Systems often utilize synchronizer logic circuits used to transmit data between different clock domains to avoid metastability and other problematic timing conditions. Synchronizers generally comprise flip-flop circuits that introduce signal delays to allow oscillations to settle down to produce a stable output at the destination domain.

Predictive synchronizers have been developed that use information about the transmitting and receiving clock domains to decrease both failure rate and data transmission latency. Predictive synchronization is advantageous in that it is low latency (assuming the prediction data is correct) and can completely avoid the chance of metastability. However, if the clock frequency in either the receive or transmit domains goes outside of an acceptable range due to drift or active ramping then miss-predictions may occur. Such miss-predictions cause a high chance of metastability which breaks any logic connected to the synchronizer and defeats the purpose of the synchronizer. Existing predictive synchronizers have generally used high latency measurement circuits to get the information they need from the transmit and receive clock domains, and these systems expect transmit and receive frequencies to stay within a certain range around the measured value during the entire operation. Existing predictive synchronizers thus require information collected from frequency measurement circuits with high latency. This information is acquired during a measurement state and is not revisited during normal operation, with the system assuming that frequencies will stay within a small range. This means that if either clock frequency (receive/transmit or source/destination) goes outside of the acceptable range due to frequency drift or active ramping then miss-predictions will occur causing a high chance of metastability.

Although current predictive synchronizer designs perform satisfactorily when used with static frequency devices, many SOC devices purposely utilize frequency drift or frequency ramping within one or more domains to enhance certain performance or operating characteristics. For example, active frequency ramping (up or down) occurs in a number of SOCs and is a key mechanism in devices that feature dynamic frequency scaling (DFS) or dynamic voltage scaling (DVS) whereby performance or power consumption of the device is reduced based on work load or operational characteristics to save power or reduce the amount of heat generated by the device. Present predictive synchronizer circuits are of limited usefulness in such SOC devices because of their inability to efficiently accommodate dynamic frequency changes in different clock domains.

A particular predictive synchronizer has been developed for periodic clock domains in which two versions of data are latched and selected according to the output of a phase comparator that compares the two domain clocks. As stated above, such a circuit requires advanced knowledge of the transmit and receive frequencies and is non-adaptive with respect to changing or ramping frequencies. Certain other predictive synchronizers have been developed that accommodate variable frequencies, however such systems generally do not provide continuous frequency measurement and uninterrupted synchronization. In general, present predictive synchronizers use measurement circuits to get the information they need from the transmit and receive clock domains. These circuits require many cycles to complete measurement and must be restarted for every change in receive or transmit clock frequency. Thus, existing predictive synchronizers require information collected from measurement circuits with high latency.

What is needed, therefore, is a system and method provides frequency information directly to a predictive synchronizer as soon as the frequency changes in either or both of the transmit and receive clock domains in order to eliminate the latency associated with the frequency measurement circuits used in present heterochronous synchronizer systems.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY OF EMBODIMENTS

Some embodiments are described for a method for enabling updates from a clock controller to be sent directly to a predictive synchronizer to manage instant or near-instant changes in frequency between transmit and receive clock domains by receiving receive and transmit reference frequencies from a phase-locked loop circuit, receiving receive and transmit constant codes from a controller coupled to the phase-locked loop circuit, obtaining a time delay factor to accommodate phase detection between the transmit and receive clock domains, and calculating new detection interval and frequency information using the time delay factor, the reference frequencies and the constant codes. The controller may be coupled to the phase-locked loop circuit through a delay circuit, and the method may further comprise transmitting a transmit clock reference frequency to a transmit phase-locked loop circuit to generate the transmit reference frequency, and transmitting a receive clock reference frequency to a receive phase-locked loop circuit to generate the receive reference frequency. The phase-locked loop circuit may comprise one of the transmit phase-locked loop circuit and the receive phase-locked loop circuit. In a method under some embodiments, the constant codes comprise at least one of a plurality of multiply/divide constants of the phase-locked loop circuit, and these constant codes may be stored as digital values in coded registers. The time delay factor generally corresponds to a phase detector delay time, and the method may further comprise providing the time delay factor to the predictive synchronizer through a programmable register as part of a boundary scan process. The predictive synchronizer of this method may be used in a system-on-chip device in which the clock frequencies may drift or ramp within each domain of the transmit and receive clock domains.

Embodiments are further directed to a method of synchronizing the transfer of data from a transmit clock domain to a receive clock domain, comprising receiving a new frequency signal indicating a change in frequency in at least one of the transmit clock domain and receive clock domain, de-asserting a data ready signal to suspend data transfers while a new frequency value and new detection interval value is calculated, calculating the new frequency value and new detection interval value using phase-locked loop constant code and reference frequency values, and re-asserting the data ready signal upon calculation of the new frequency value and new detection interval value. The method may further comprise obtaining a time delay factor to calculate the detection interval value, and the time delay factor is generally a value configured to accommodate phase detection between the transmit and receive clock domains. In an embodiment, the detection interval equals the time delay factor multiplied by the transmit clock frequency, and the new frequency value is equal to the transmit clock frequency and the receive clock frequency. The method under embodiments further comprises receiving a frequency update signal from a phase-locked loop controller to generate new phase-locked loop constant code, and wherein a new frequency value and detection interval is calculated every time a new phase-locked loop constant code is generated. The method may yet further comprise providing even and odd edge detection values of the transmit clock to a phase estimator circuit, wherein the phase estimator circuit derives an estimated phase of the transmit clock, and processing the estimated phase of the transmit clock and data transmitted from the transmit clock domain in an even/odd synchronizer to generate receive data synchronized to the receive clock domain frequency, and wherein the even/odd synchronizer calculates the ratio of the transmit clock frequency to the receive clock frequency based on estimated phase information provided by the phase estimator circuit.

Some embodiments are directed to an apparatus or system comprising one or more processing elements that perform the acts or process steps of the two methods described above.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
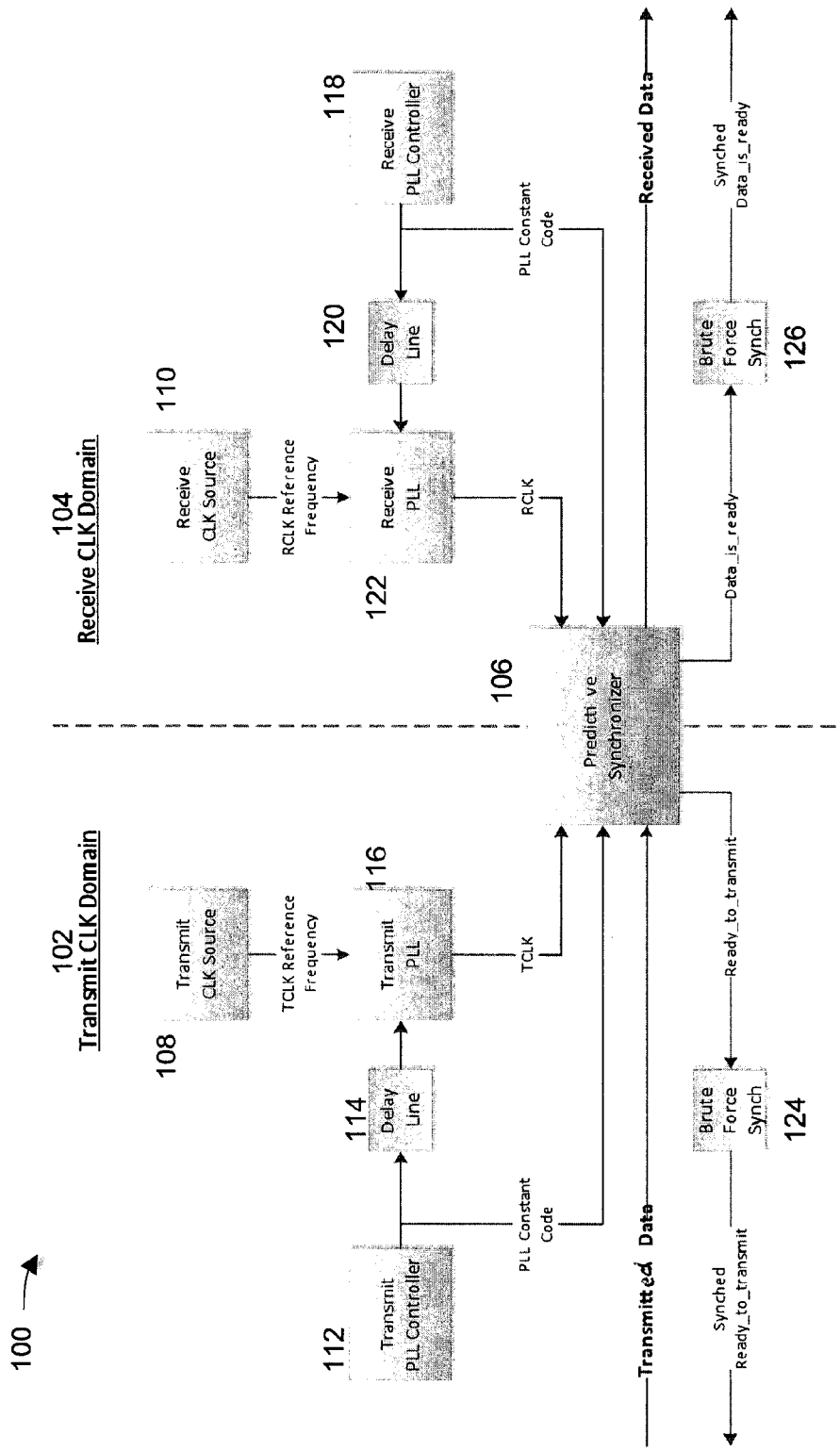
FIG. 1 is a block diagram of a low-latency predictive synchronizer system utilizing phase-locked loop control circuits, under some embodiments.

Embodiments are generally directed to a system and method for providing immediate frequency measurement for predictive periodic synchronizers used in SOC and similar devices that feature different clock domains with frequencies that may drift or ramp within each domain. To avoid the added measurement latency required after frequency changes, embodiments use transmit and receive phase-locked loop (PLL) circuits to send frequency information directly to the synchronizer as soon as the frequency changes, typically within a single clock cycle. The necessary information is provided by the separate PLL circuits in each clock domain directly, thus eliminating the need for a measurement circuit and the associated measurement latency. Such a system allows the predictive synchronizer to accommodate synchronization of frequency changes within a single clock cycle (e.g., transitioning from 1 GHz to 2 GHz in a single cycle). The PLL-based control circuit enables updates from the clock controller to be sent directly to the predictive synchronizer to manage instant changes in frequency between the transmit clock and receive clock domains.

Any of the embodiments described herein may be used alone or together with one another in any combination. The one or more implementations encompassed within this specification may also include embodiments that are only partially mentioned or alluded to or are not mentioned or alluded to at all in this description or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Embodiments include an immediate frequency measurement mechanism for use with predictive synchronizers. In a non-dynamic predictive synchronizer, information regarding transmit and receive frequencies in heterochronous or periodic domains is generally supplied by a measurement circuit that is used only once during startup of the system. This synchronizer requires a measured value of the ratio between the transmit clock (tclock or tclk) frequency and the receive clock (rclock or rclk) frequency ($f=f_t/f_r$) as well as the time delay used in the phase detection circuit in terms of the transmit clock frequency ($d=t_d/t_{tcy}$). Since the measurement circuit requires many clock cycles to wait for large counters to overflow, the measurement process takes a relatively long time, such as on the order of 1024 cycles for a counter that is $2^{10}$ bits wide. This latency would be incurred every time the transmit or receive clock frequencies drift or ramp outside of the acceptable range since the frequency ratio and time delay will need to be re-measured for each frequency change event. A current solution to this problem in known systems is to switch to a brute force (therefore high latency) synchronizer when clock frequencies leave the measured range. This is generally impractical in the likely situation that clock frequencies settle at values previously not measured or continuously ramp. In these situations, the circuit will have no choice but to continue using the brute force synchronizer and will never benefit from the low latency predictive synchronization.

Although embodiments are described with respect to heterochronous timing domains, it should be noted that embodiments may be applied to any system in which synchronization between two circuits operating at different frequencies is required, and in which the frequency in either or both circuits may vary or drift over time. A heterochronous or periodic system is generally one in which the transmit and receive clock domains operate at nominally different clock frequencies. The frequencies may differ from each other by a defined minimum frequency value based on operating characteristics of the two domains, or the two frequencies may be set by individual timing circuits or a common timing circuit that generates different timing domains through the use of dividers, multipliers, or other logic circuits.

As mentioned, the standard predictive synchronizer uses high latency (e.g., 1024 cycles) measurement circuits to acquire the information necessary to operate the prediction logic of the predictive synchronizer. This method is generally used in systems in which it is expected that clock frequencies will not change. In the event of any change in frequency, these systems typically default to high latency brute force synchronizers whenever the frequencies go outside of the predicted range. This wastes any benefit that predictive synchronization would generally provide. In present systems, there is also the option of re-running the measurement circuit, but this requires the high latency circuits to run after every single frequency change, thus hurting the data bandwidth considerably.

To avoid the large measurement latency associated with present systems that default to brute force synchronization or use re-measurement operations, embodiments include circuits and methods that determine and process the frequency change information necessary to operate the prediction logic in the synchronizer. In an embodiment, one or more phase-locked loop circuits are used to take domain clock frequency information and provide that information directly to a predictive synchronizer. Embodiments are thus described for a method for enabling updates from a clock controller to be sent directly to a predictive synchronizer to manage instant changes in frequency between transmit and receive clock domains. In general, such instant changes are considered to be frequency changes that occur within a single clock cycle of either clock, or a fraction of a clock cycle. In certain cases, an instant change may occur over a few clock cycles or multiples of a single cycle, but is generally considered to be a relatively rapid change.

In general, a phase-locked loop is a control circuit that generates an output circuit with a phase that is related to the phase of an input signal. It comprises an variable frequency oscillator that generates a periodic signal, along with a phase detector that compares the phase of the oscillator signal with the phase of the input signal. The oscillator is adjusted to keep the phases matched through a feedback circuit that takes the output signal back to the input signal for comparison. PLLs are typically used in integrated circuits to generate a clock signal from a reference frequency. The output frequency of a PLL is equivalent to the reference frequency multiplied by a certain constant. In an embodiment, the PLL circuits described herein generally comprise a phase detector, low-pass filter, variable-frequency oscillator, and feedback path, in any arrangement suitable for use in the illustrated systems. Depending on circuit implementation, the PLL circuits may be implemented in the form of analog or linear PLLs, digital PLLs, software PLLs, or other appropriate type of functional component. Although embodiments are described with respect to PLL circuits, it should be noted that other types of circuits that keep input and output phases and frequencies in lock or in sync may also be used.

FIG. 1 is a block diagram of a low-latency predictive synchronizer system utilizing phase-locked loop control circuits, under some embodiments. System 100 illustrates the flow of data through the system as well as the control schemes for the clock tree in each of the clock domains. As shown in system 100 of FIG. 1, predictive synchronizer 106 synchronizes the transmission of transmitted data from transmit clock domain 102 to produce received data in the receive clock domain 104. The clock frequency in the transmit clock domain 102 is set by the transmit clock source 108 and the clock frequency in the receive clock domain 104 is set by the receive clock source 104. In system 100, the transmit clock reference frequency is provided from the transmit clock source 108 to a transmit PLL circuit 116. This comprises the reference frequency for the PLL, which is then multiplied by a constant to produce the transmit clock (tclk) signal that is input to the predictive synchronizer 106. Likewise, for the receive clock domain 104, the clock frequency in the receive clock reference frequency is provided from the receive clock source 110 to a receive PLL circuit 122. This comprises the reference frequency for the PLL, which is then multiplied by a constant to produce the receive clock (rclk) signal that is input to the predictive synchronizer 106.

When an SOC or other device encompassing system 100 needs to change the frequency of a clock domain (transmit and/or receive), it will change the PLL constant of the appropriate clock domain PLL 116 or 122 thereby changing the output frequency tclk or rclk. In an embodiment, this constant is known by the system and can be represented as a digital value. The tclk and rclk reference frequencies can also be represented as a digital value. As shown in FIG. 1, PLL constant codes are provided to each of the transmit and receive PLL circuits 116 and 122 by respective transmit and receive PLL controllers 112 and 118. In an embodiment, the reference frequencies for both transmit and receive clocks ($f_{tref}$ and $f_{rref}$) as are stored digital values in registers that can be accessed by the predictive synchronizer 106. In general, each PLL has a customizable feedback loop based on changing the multiplication or division ratio between the signal being tracked and the output oscillator. Since PLLs generally have a finite number of options for multiply/divide constants, all of the possible transmit and receive PLL constants ($Const_{tPLL}$ and $Const_{rPLL}$) are stored as digital values in coded registers within or accessed by the respective PLL controllers 112 and 118. Both the transmit and receive PLLs 116 and 122 and the predictive synchronizer 106 are sent codes that correspond to specific PLL constant values when a frequency change occurs. This prevents the need to provide a wide bus to represent the full digital value of the multiply/divider constants. With all four of these relevant values ($f_{tref}$, $Const_{tPLL}$, $f_{rref}$, $Const_{rPLL}$) available to the predictive synchronizer 106 in digital form, the synchronizer can make the necessary calculations to predict possible conflicts in the receive and transmit clock. These calculations could be done with standard binary multiplier and divider circuits with very low latency. This means that all of the benefits of a predictive synchronizer (i.e., less than a cycle of latency with no chance of metastability) can be achieved without any high latency measurement systems needed in previous predictive synchronizer systems.

As shown in FIG. 1, these constant codes from the transmit and receive PLL controllers 112 and 122 are delayed through delay lines 114 and 120 when sent to the PLLs 116 and 122, but are sent directly to the predictive synchronizer 106. This structure is preferred because the predictive synchronizer interprets PLL constant code changes as a 'reset' signal. Immediately after a reset, the predictive synchronizer 106 is typically not ready to transfer data since some time is required to retrack the new clock. The result of this reset is that the two 'ready' signals (for receive and transmit) will go low so that each clock domain 102 and 104 knows that data is not being transmitted. In system 100, these ready signals (ready_ to_transmit and data_is_ready) are brute force synchronized through synchronizers 124 and 126 to their respective domains. Brute force synchronization is performed because of the fact that during the time of a de-asserted ready line, the predictive synchronizer is unable to synchronize properly and so usually cannot synchronize the ready lines. The brute force synchronization provides some amount of latency before both of the clock domains can be told that data is not being transferred. If the respective PLL was changed before the de-asserted ready signal could propagate through this brute force synchronization delay, both domains would expect that the predictive synchronizer was still ready to transmit data even though it was not. To avoid this problem, the delay lines 114 and 120 are used in both of the clock domains to match this delay. Thus, delay lines 114 and 120 are configured to match the latency provided by the synchronizers 124 and 126, respectively. The appropriate PLL 116 or 122 is only updated after the synchronization has occurred. The predictive synchronizer 106 is provided the code change first, and will de-assert the ready lines. This de-assertion will be synchronized to both domains 102 and 104, and by the time the brute force synchronization is complete the code change will have propagated through the appropriate delay line, this then finally changes the corresponding PLL output frequency. It is important to note that both delay lines 114 and 120 in each clock domain must be calibrated to the longest possible delay that the brute force synchronization could take in either of the two clock domains. This value could either be set for the absolute worst case (e.g., as based on operational characteristics), or could be calculated based on the known clock frequencies known in each domain.

Figure 2:
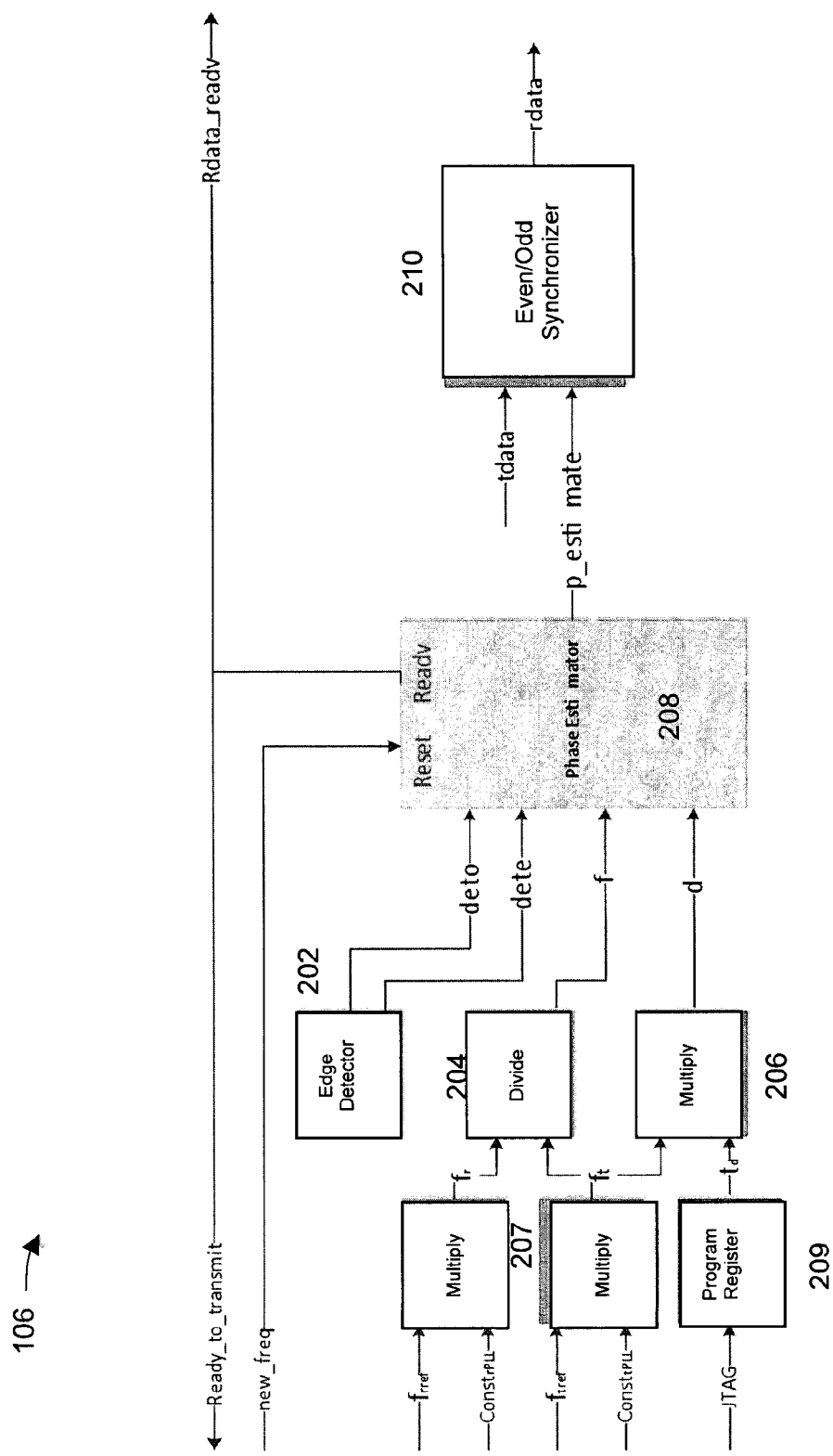
FIG. 2 is a block diagram illustrating components of the predictive synchronizer of FIG. 1, under some embodiments.

As shown in FIG. 1, the predictive synchronizer component 106 receives the transmitted data at the frequency of the transmit clock domain and outputs received data at the frequency of the receive clock domain. This component takes the reference frequencies for both transmit and receive clocks ($f_{tref}$ and $f_{rref}$) from the clock sources 108 and 110 through the transmit and receive PLLs 116 and 122, and the transmit and receive PLL constants ($Const_{tPLL}$ and $Const_{rPLL}$) from the transmit and receive controllers 112 and 118. It then outputs the ready_to_transmit and data_is_ready signals. FIG. 2 is a block diagram illustrating components of the predictive synchronizer of FIG. 1, under some embodiments. Circuit 106 of FIG. 1 comprises an edge detector (also referred to as a phase detection unit) 202 coupled to a phase estimator 208 that provides an estimate of the transmit clock phase to a periodic synchronizer 110. In an embodiment, the periodic synchronizer 210 may be implemented as an even/odd synchronizer that transmits a data signal from the transmit clock domain to the receive clock domain, and which is described in greater detail below.

The predictive synchronizer 106 also includes frequency (f) and detection interval (d) measurement circuits that are embodied by a circuit comprising three multipliers 207, 209 and a divider 204. The purpose of this circuit is to measure f, or $f_t/f_r$, the ratio between the transmit and receive frequencies. The expression for f as calculated in this embodiment is as follows:

$$f = \frac{f_t}{f_r} = \frac{f_{tref} * Const_{tPLL}}{f_{rref} * Const_{rPLL}}$$

The purpose of the detection interval measurement portion of the circuit is to measure d, or $f_t*t_d$, which is the time delay used in the phase detection circuit 202 in terms of the transmit clock frequency. The expression for d as calculated in this embodiment is as follows:

$$d = f_t * t_d = (f_{tref} * Const_{tPLL}) * t_d$$

As shown in FIGS. 1 and 2, the reference frequencies and PLL constant values are read into the circuit 106 from the PLL circuits, however, the $t_d$ signal, which represents the delay time used in the phase estimator 208 is provided separately. In the embodiment shown, this delay time is a digital value which is read into a multiplier 206, along with $f_t$, to produce the digital value d. In general, since the value of $t_d$ cannot be known before creation of the integrated circuit (IC) or device that encompasses circuit 106, in an embodiment a JTAG (Joint Test Action Group) mechanism may used to program a register 209 with the correct value. Alternatively, other Test Access Port or boundary-scan mechanisms may be used, as well as other known means of programming values for use in digital circuits.

Both the frequency and detection intervals are required to predict clock conflicts with the phase estimator 208, as is typical in predictive synchronizer operation. The edge detector circuit 202 provides the even and odd edge detection signals (dete, deto) and runs continuously in parallel with the data transfer, thus this function does not add any extra latency and does not require any measurement or calculation.

Figure 3:
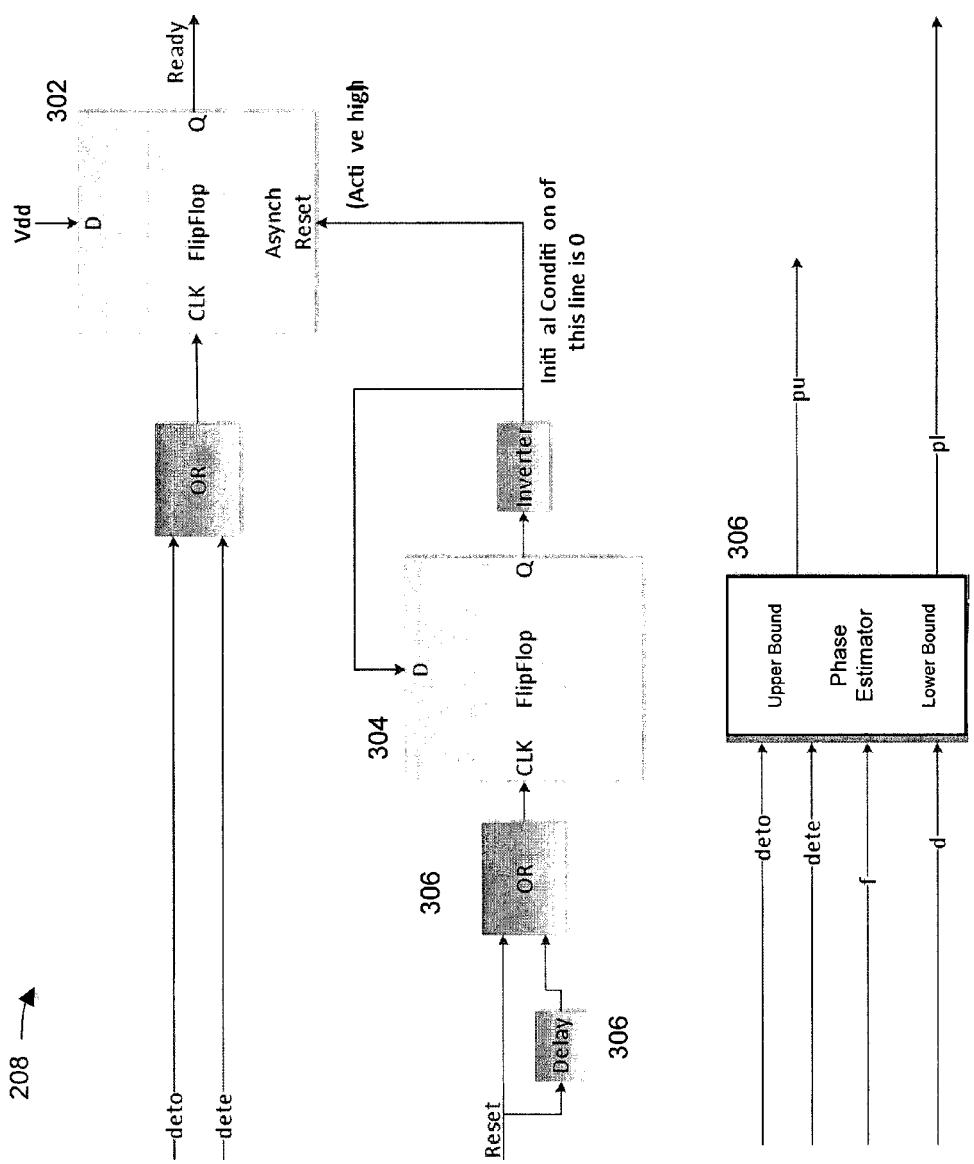
FIG. 3 is a block diagram of a phase estimator circuit that may be used in a predictive synchronizer, under some embodiments.

The phase estimator 208 also receives certain control logic signals to its reset and ready inputs. The reset and ready signals control the assertion and de-assertion of the data ready line(s) and are generally required to provide any necessary time for the phase estimator to regain tracking even though the PLLs instantly transmit information to the phase estimator regarding any changes in frequency. It should be noted that this re-tracking time is substantially faster than the large number of cycles necessary to re-measure a change in frequency, as required in present synchronizer designs. FIG. 3 is a block diagram of a phase estimator circuit that may be used in a predictive synchronizer, under some embodiments. As shown in FIG. 3, the phase estimator circuit 208 comprises two flip-flop circuits 302 and 304, and some associated logic circuits to output a ready signal from the deto and dete inputs. A small reset pulse will cause the circuit to asynchronously reset (hold the output at zero) the second flip-flop 304 for the duration of the delay 306. The delay line is calibrated to provide a delay corresponding to the delay in the calculation of the frequency, f. After this asynchronous reset is released, the resettable flip-flop 302 will wait for an even or odd edge to be detected (deto or dete has a rising edge). Once this occurs the ready signal will be asserted meaning that tracking has begun again. The reset circuit comprising delay line 306 and OR circuit 308 will break if the reset pulse is longer than the delay line 306. In an embodiment, the core phase estimator unit 306 of phase estimator circuit 208 produces upper (pu) and lower (pl) bound estimates of the transmit clock phase, which together form the p_estimate signal transmitted by phase estimator 208 shown in FIG. 2. A specific circuit embodying core phase estimator 306 is described more fully below.

Figure 4:
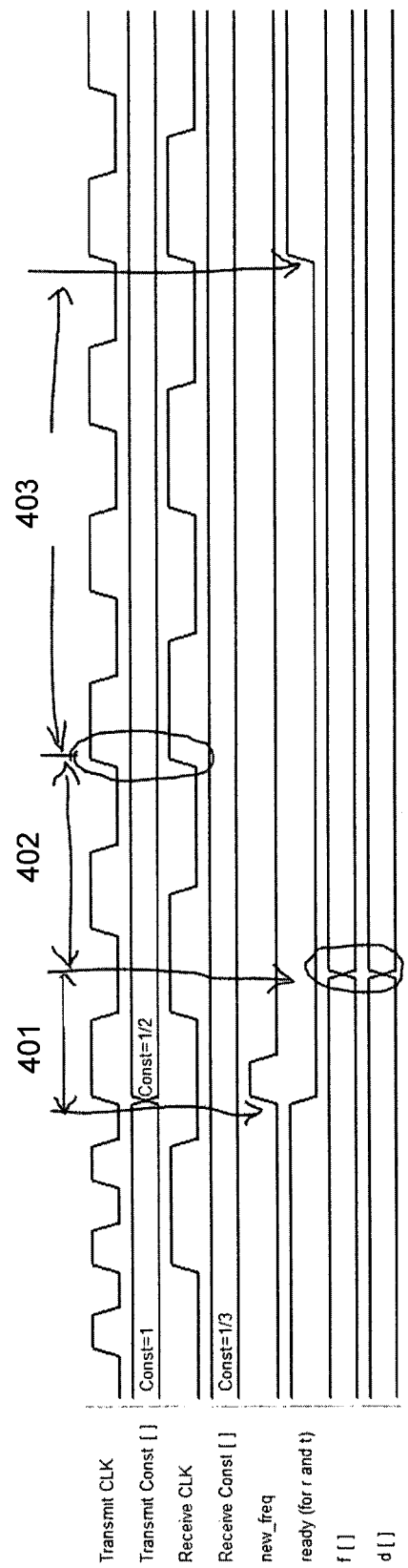
FIG. 4 is a timing diagram that illustrates the operation of a PLL-based predictive synchronizer, under some embodiments.

FIG. 4 is a timing diagram that illustrates the operation of a PLL-based predictive synchronizer, under some embodiments. The timing diagram 400 starts during normal operation with constant transmit clock and receive clock signals. A change in the transmit clock frequency is seen at the onset of time segment 401, which corresponds to the new_freq line going high. This change in frequency is due to the fact that the transmit PLL 116 has changed its constant. In the example shown in FIG. 4, the transmit clock frequency is being cut in half (period doubles) while the receive clock is unchanged, though of course many other changes are also possible. As soon as the change is made, the PLL sends both its new constant value and a pulse on the new_freq line, telling the phase estimator 208 that the frequency has changed (if both rclk and tclk change two new frequency pulses would be generated). The circuit then takes some time to calculate the new values of f and d, which is represented by the duration of time interval 401. Once these calculations are completed, the circuit waits for an edge to be detected. This means that inside the phase estimator 208, the asynchronous reset on the second flip-flop 302 has been de-asserted. This waiting period is represented by time interval 402.

Once an edge has been detected, the edge detector 202 must wait a number n receive clock cycles until it can tell the phase estimator 208 that it has seen an edge. This is because the brute force synchronizers used in the edge detector need time before they can assert their output. The value n refers to the number of stages (therefore the latency) in the edge detector's brute force synchronizers. In the example, timing diagram 400, n is set at 2, although in practice most brute force synchronizers may be three or four stages to reduce the chance of metastability. These two receive clock cycles are represented in FIG. 4 by time interval 403. Once a dete or deto edge has been seen by the phase detector, the ready line is again re-asserted and the synchronizer is again ready to take in data.

As can be inferred by the timing diagram of FIG. 4, instead of requiring a wait for large counters to overflow (often thousands of cycles) as in present systems, the PLL-based predictive synchronizer calculates a new frequency ratio within only a few clock cycles, which dramatically reduces data latency during frequency changes. As mentioned previously, these frequency changes occur more often in modern systems with the adoption of dynamic frequency scaling (DFS) and similar mechanisms, which makes this latency even more important to the speed of the whole system.

Figure 5:
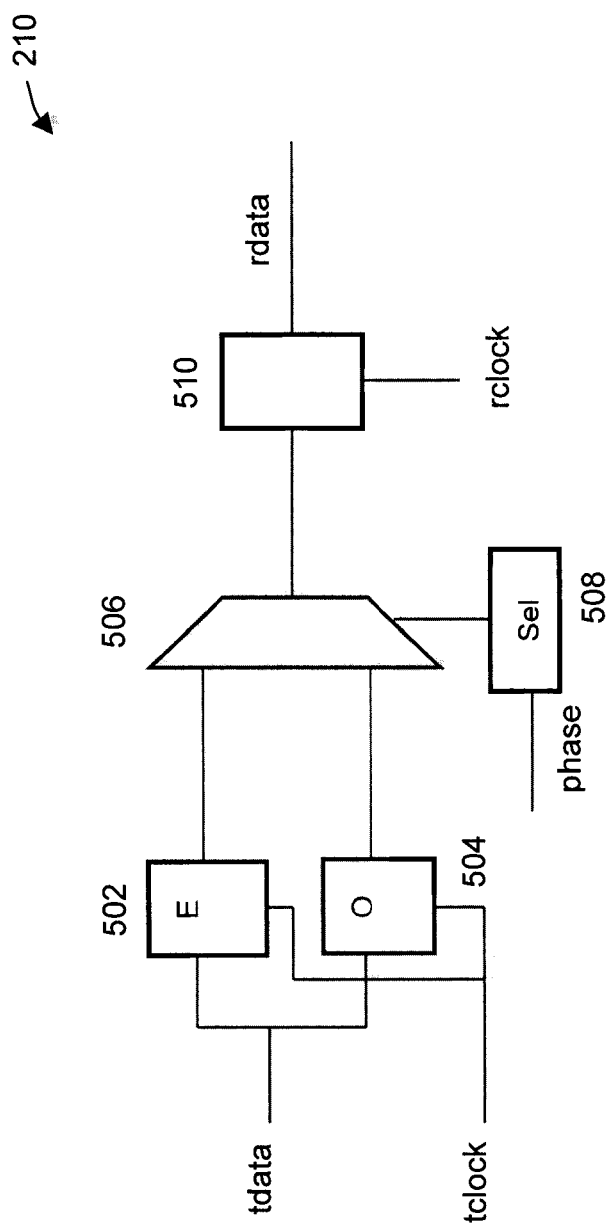
FIG. 5 illustrates an even/odd periodic synchronizer that may be used with embodiments of a PLL-based predictive synchronizer, under some embodiments.

With reference to FIG. 2, the predictive synchronizer component 106 includes several components such as a phase estimator 208 and a even/odd synchronizer 210. For this embodiment, the periodic synchronizer is implemented as an even/odd synchronizer that transmits a data signal from a transmit clock domain to a receive clock domain. FIG. 5 illustrates an even/odd periodic synchronizer that may be used with embodiments of a PLL-based predictive synchronizer, under some embodiments. The synchronizer 210 shown in FIG. 5 writes the transmit data (tdata) to alternately to a pair of registers 502 and 504, denoted even (E) and odd (O), respectively. An even or odd control signal coupled to both registers causes the data to be written to the even register on even transmit clock (tclock) cycles and to the odd register on odd tclock cycles. A multiplexer 506 and selection circuit 508 allows the receiver to select the most recently written register that is safe to sample at the end of the current receive clock (rclock) cycle. This selection is based on the predicted tclock phase at the end of the current rclock phase input to the selection circuit 508. The selected data is then output from latch 506 as receive data (rdata) synchronized to the receive clock rclock. It should be noted that the even/odd synchronizer illustrated in FIG. 5 is one example of a periodic synchronizer that can be used in conjunction with embodiments of the PLL-based predictive synchronizer system, and other types and implementations of periodic synchronizers may also be used.

In an embodiment, the tclock phase provided to the selection circuit 508 is not known absolutely, but is instead estimated using phase estimator 208. Thus, as shown in FIGS. 2 and 4, the phase information provided to the periodic synchronizer corresponds to the phase estimate (p_estimate) signal output from the phase estimator 208, and which may be comprised of upper and lower bound estimates from core phase estimator 306. For the system shown in FIG. 2, the phase estimator generates an estimated tclock phase based on certain input from an edge detector component 202 and frequency measurement and detection interval measurement components comprising circuits 204, 206, 207, and 209. In an embodiment, the edge detector 202 is a circuit that is configured to detect when a transition on a transmit data signal falls within a defined time window around the receive clock (rclk) edge. The circuit may comprise a suitable arrangement of flip-flop and logic circuits to sample delayed tclock and rclock signals to generate early and late samples that are synchronized to the receive clock domain by one or more synchronizer circuits. Differences between early and late circuits are detected by logic circuits that generate appropriate edge detection signals. For the embodiment of FIG. 2, if the early sample is high and the late sample is low, an even edge of tclock is detected and the dete (even detection) signal is asserted. Conversely, if the early sample is low and the late sample is high, an odd edge of tclk is detected and the deto (odd detection) signal is asserted.

In an embodiment, the phase estimator circuit 208 may be implemented through a circuit configured to produce lower and upper bound estimates of the tclock phase. When the phase estimates are valid, the transmitter phase is known to be within the interval defined by these upper and lower bound estimates. In operation, the phase estimator receives the edge detection information from the edge detector 202. On each edge detection, the phase estimates are initialized to an initial value and then advanced in by an appropriate value based on whether an edge is detected or not detected. The system selects the most recent safe register to sample based on the lower bound of the transmit phase and the select circuit 508 samples the even register 502 if the phase is within a defined range, or the odd register 504 if it is not.

Figure 6:
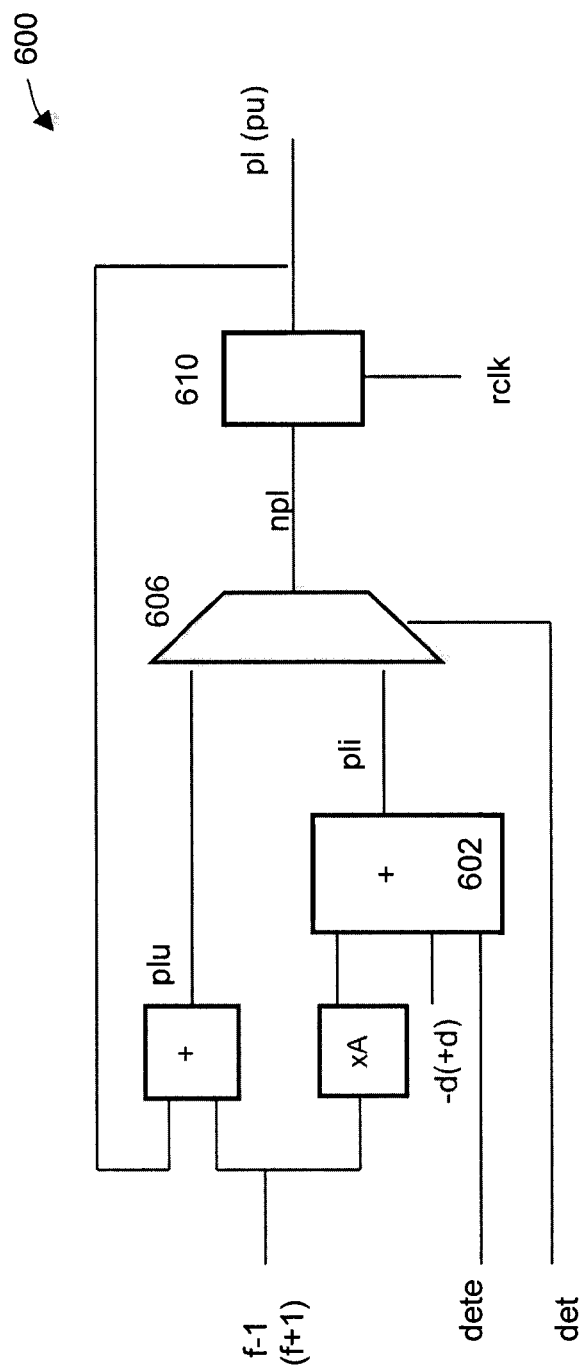
FIG. 6 illustrates a phase estimator that may be used with embodiments of a PLL-based predictive synchronizer, under some embodiments.

As shown in FIG. 3, a core phase estimator component 306 includes upper bound and lower bound components that output the upper (pu) and lower (pl) bound estimates of the transmit clock phase for use by the phase estimator 208. FIG. 6 is a block diagram of a phase estimation circuit that may be used to generate the upper and lower bound estimates, under some embodiments. As shown in FIG. 6, two separate circuits are required to produce the pl and pu estimate values with the necessary inputs and outputs for the pu estimate circuit shown in parenthesis. When the phase estimates are valid, the transmitter phase is known to be in the interval [pl, pu]. On each phase detection, the phase estimates are initialized to [−d, d], because the phase is known to be in this interval during detection, the even bit is set if an even edge was detected, and then the phase estimate is advanced in time by a number of cycles. On cycles when a detection does not occur, the phase estimates are updated by adding $f-2^{-b}$ and $f+2^{-b}$ to pl and pu respectively. The A-cycle time advance is accomplished by adding A times the frequency estimate to the initial phase. The advance A is S+1, where S is the delay of the brute force synchronizers in the phase detector. Advancing by S cancels the delay of the phase detector, and advancing one more cycle makes the phase estimate reflect the transmit clock phase at the end of the current receive clock cycle. The system selects the most recent safe register to sample based on the lower bound of the transmit phase, pl. When pl is within the range x, 1+x, the select signal is configured to sample the even (E) register, otherwise it samples the odd (O) register. Tracking the upper bound of the transmit phase allows the determination of when the phase estimate is no longer accurate enough to be used, and it is no longer useful when pu−pl>1-2x.

Figure 7:
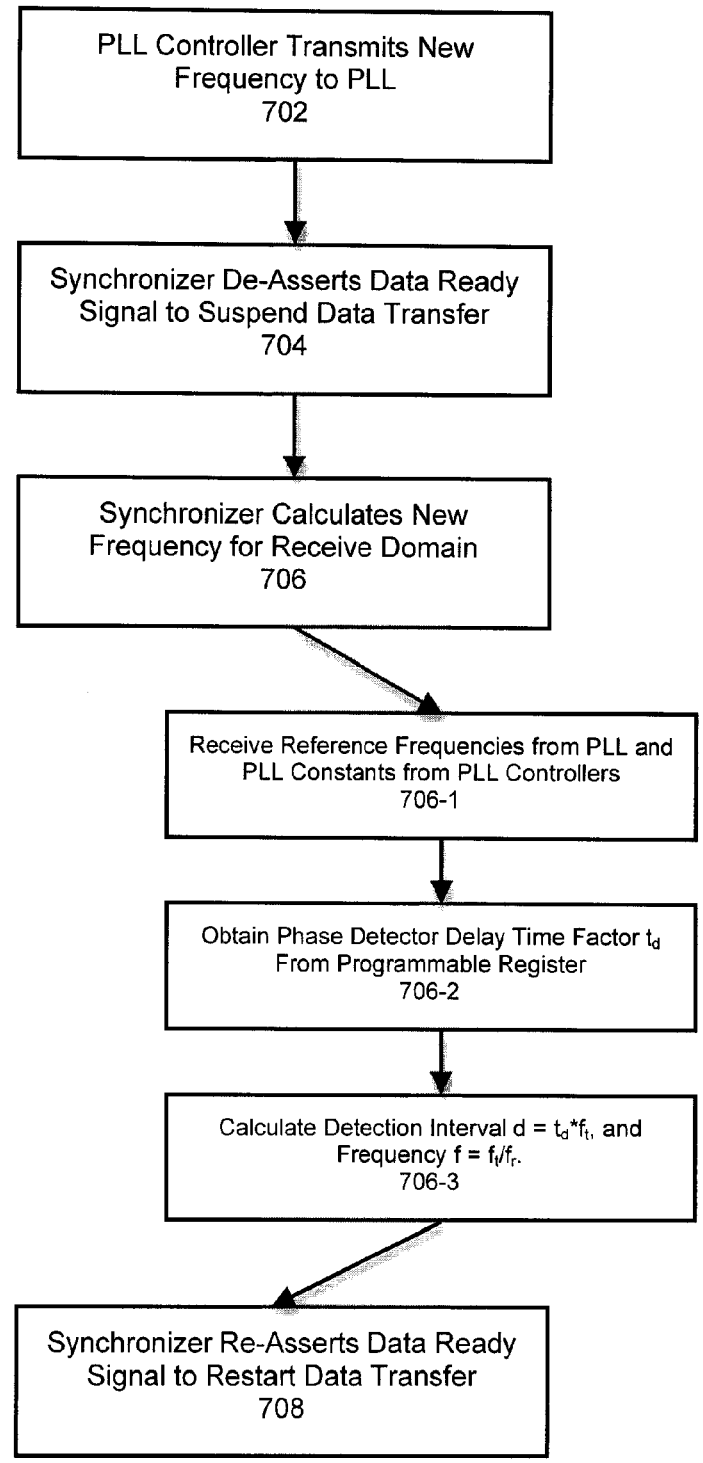
FIG. 7 is a flow diagram illustrating a method of performing predictive synchronization using PLL control signals, under an embodiment.

With reference to the system and components illustrated in FIGS. 1 and 2, FIG. 7 is a flow diagram illustrating a method of performing predictive synchronization using PLL control signals, under an embodiment. The synchronization process begins when the PLL controller for either clock domain (transmit or receive) 112 or 118 transmits a new frequency to it corresponding PLL 116 or 122, block 702. Upon receiving the new frequency information, the synchronizer 116 de-asserts the data_is_ready signal to suspend data transfers, block 704, so that the new frequency information can be calculated, block 706. This calculation is illustrated in blocks 706-1 to 706-3 in which the synchronizer receives the reference frequencies $f_{rref}$ and $f_{tref}$ from the PLL 116 or 122, and the PLL constants $Const_{rPLL}$ and $Const_{tPLL}$ from the PLL controllers 112 or 118, block 706-1. The synchronizer obtains the time factor $t_d$, which is the delay time for the phase detector from a programmable register or other appropriate storage or programming mechanism, block 706-2. Using these factors, the synchronizer then calculates the detection interval d and frequency f using the following equations: $d=t_d*f_t$, and $f=f_t/f_r$, block 706-3. Once these calculations are performed and the new frequency is determined, the synchronizer re-asserts the data_is_ready signal to restart data transfer between the two clock domains, block 708.

Embodiments allow the use of predictive synchronization with frequency ramping or systems with disparate frequency domains in which the frequencies in the different domains is not static. In general, synchronization is necessary whenever multiple clock domains need to communicate to each other, and predictive synchronization is the best way to get low latency data transfer between domains. Current systems have not efficiently accommodated frequency domains that feature dynamic frequency shifts, often requiring the use of brute force synchronizers and thus introducing excess latency back into the system. As frequency ramping and clock drift are being used in more and more SOCs, an immediate frequency update system for predictive synchronizers, as described herein provides effective frequency updates for fast synchronization without incurring the latencies associated with brute force synchronizers. Embodiments of the PLL-based predictive synchronization system take clock frequency information directly from the transmit and receive PLL circuits to efficiently manage changes in frequency due to frequency scaling or ramping. The PLL circuits tell the synchronizer exactly what is happening with regard to frequency changes directly and immediately. The PLL-based circuit obtains up-to-date digital values for the ratio of frequencies between the transmit and receive clock domains through the use of PLL updates.

Although embodiments have been described for use in relation to one or more types of predictive periodic synchronizers, it should be noted that such embodiments may also be used and/or modified for use with other types of predictive synchronizers to allow for them to work with changing frequencies as well.

For purposes of the present description, the terms "component," "module," "circuit," and "process," may be used interchangeably to refer to a circuit element or processing unit that performs a particular function. Such a function may be implemented purely in hardware or it may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method described herein.

Some embodiments are also directed to computer readable media comprising a data structure that is operated upon by a program executable on a computer system. The program operates on the data structure to perform a portion of a process to fabricate an integrated circuit including circuitry described by the data structure. The circuitry described in the data structure includes providing a method of taking immediate frequency measurements of different domains in a heterochronous system in which the frequency in at least one domain of two different clock domains changes or varies at a rate exceeding a minimal frequency error range.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for synchronizing a frequency change between two clock domains, comprising:
   receiving receive and transmit reference frequencies from a phase-locked loop circuit;
   receiving receive and transmit constant codes from a controller coupled to the phase-locked loop circuit through a delay circuit;
   obtaining a time delay factor to accommodate phase detection between the transmit and receive clock domains;
   calculating updated detection interval and frequency information using the time delay factor, the reference frequencies, and the constant codes to enable updates from a clock source to be sent directly to a synchronizer to manage changes in frequency between the transmit and receive clock domains;
   transmitting a transmit clock reference frequency to a transmit phase-locked loop circuit to generate the transmit reference frequency; and
   transmitting a receive clock reference frequency to a receive phase-locked loop circuit to generate the receive reference frequency, and wherein the phase-locked loop circuit comprises one of the transmit phase-locked loop circuit and the receive phase-locked loop circuit.

2. The method of claim 1 wherein the receive and transmit constant codes comprise at least one of a plurality of multiply/divide constants of the phase-locked loop circuit, and wherein the constant codes are stored as digital values in coded registers.

3. The method of claim 1 wherein the time delay factor corresponds to a phase detector delay time.

4. The method of claim 1 further comprising providing the time delay factor to the predictive synchronizer through a programmable register as part of a boundary scan process.

5. The method of claim 1 wherein the predictive synchronizer is used in a system-on-chip device in which the clock frequencies may drift or ramp within each domain of the transmit and receive clock domains.

6. A method of synchronizing transfer of data from a transmit clock domain to a receive clock domain, comprising:
  receiving a new frequency signal indicating a change from an initial frequency in at least one of the transmit clock domain and receive clock domain;
  de-asserting a data ready signal to suspend data transfers while a new frequency value and new detection interval value is calculated from the initial frequency and an initial detection interval;
  calculating the new frequency value and new detection interval value using phase-locked loop constant code and reference frequency values;
  re-asserting the data ready signal upon calculation of the new frequency value and new detection interval value; and
  obtaining a time delay factor to calculate the detection interval value, wherein the time delay factor is a value configured to accommodate phase detection between the transmit and receive clock domains, and further wherein the detection interval value equals the time delay factor multiplied by the transmit clock frequency.

7. The method of claim 6 wherein the new frequency value is equal to the transmit clock frequency and the receive clock frequency.

8. The method of claim 7 further comprising receiving a frequency update signal from a phase-locked loop controller to generate new phase-locked loop constant code, and wherein a new frequency value and detection interval is calculated every time a new phase-locked loop constant code is generated.

9. The method of claim 6 further comprising providing even and odd edge detection values of the transmit clock to a phase estimator circuit, wherein the phase estimator circuit derives an estimated phase of the transmit clock.

10. The method of claim 6 further comprising processing the estimated phase of the transmit clock and data transmitted from the transmit clock domain in an even/odd synchronizer to generate receive data synchronized to the receive clock domain frequency, and wherein the even/odd synchronizer calculates the ratio of the transmit clock frequency to the receive clock frequency based on estimated phase information provided by the phase estimator circuit.

11. A circuit for synchronizing frequency updates between transmit and receive clock domains, comprising:
  a predictive synchronizer receiving receive and transmit reference frequencies from a phase-locked loop circuit;
  a phase-locked loop controller transmitting receive and transmit constant codes from to the phase-locked loop circuit upon a change in frequency in at least one of the transmit and receive clock domains;
  a delay circuit coupled between the phase-locked loop circuit and the phase-locked loop controller;
  a register providing a time delay factor to accommodate phase detection between the transmit and receive clock domains;
  a processing component calculating new detection interval and frequency information using the time delay factor, the reference frequencies, and the constant codes to enable updates from a clock controller to be sent directly to the predictive changes in frequency between the transmit and receive clock domains;
  a first transmitter transmitting a transmit clock reference frequency to a transmit phase-locked loop circuit to generate the transmit reference frequency; and
  a second transmitter transmitting a receive clock reference frequency to a receive phase-locked loop circuit to generate the receive reference frequency, and wherein the phase-locked loop circuit comprises one of the transmit phase-locked loop circuit and the receive phase-locked loop circuit, and wherein the constant codes comprise at least one of a plurality of multiply/divide constants of the phase-locked loop circuit, and wherein the constant codes are stored as digital values in coded registers.

12. The circuit of claim 11 wherein the time delay factor corresponds to a phase detector delay time, and further comprising a programmable register storing the time delay factor.

13. The circuit of claim 11 wherein the predictive synchronizer is used in a system-on-chip device in which the clock frequencies may drift or ramp within each domain of the transmit and receive clock domains.

* * * * *